United States Patent
Bang et al.

(10) Patent No.: US 7,433,178 B2
(45) Date of Patent: Oct. 7, 2008

(54) PLASMA DISPLAY APPARATUS

(75) Inventors: Won-Kyu Bang, Asan-si (KR); Ki-Jung Kim, Cheonan-si (KR)

(73) Assignee: Samsung SDI Co., Ltd., Suwon (KR)

( * ) Notice: Subject to any disclaimer, the term of this patent is extended or adjusted under 35 U.S.C. 154(b) by 727 days.

(21) Appl. No.: 10/992,216

(22) Filed: Nov. 19, 2004

(65) Prior Publication Data
US 2005/0117285 A1    Jun. 2, 2005

(30) Foreign Application Priority Data
Nov. 29, 2003  (KR)  ............... 10-2003-0086062

(51) Int. Cl.
*H01L 23/06* (2006.01)
*H05K 7/14* (2006.01)
(52) U.S. Cl. .................. 361/681; 361/683; 361/748; 361/752; 349/56; 349/58; 349/150; 349/151; 174/66; 174/68.1; 345/76; 345/173
(58) Field of Classification Search .......... 361/679, 361/681, 682, 683, 752, 816, 825, 760, 767, 361/785; 313/422, 461, 456, 402, 567, 495, 313/497, 496; 349/58, 60, 69, 113, 149; 345/76, 60–65, 173, 89, 175, 905; 315/169.1, 315/169.4, 169.3; 174/68.1, 254
See application file for complete search history.

(56) References Cited

U.S. PATENT DOCUMENTS

| 6,534,722 B2 * | 3/2003 | Takaoka ................. 174/254 |
| 6,703,702 B2 * | 3/2004 | Inoue et al. ............. 257/684 |
| 6,972,963 B1 * | 12/2005 | Chou ..................... 361/760 |

FOREIGN PATENT DOCUMENTS

JP    2003-162228    6/2003

* cited by examiner

*Primary Examiner*—Michael V Datskovskiy
(74) *Attorney, Agent, or Firm*—H.C. Park & Associates, PLC

(57) ABSTRACT

A plasma display apparatus comprising a panel displaying images, a circuit board that drives the panel, and a chassis base that supports the panel and the circuit board. A signal transfer member couples the panel and the circuit board, and a protection plate protects the signal transfer member and a device mounted on the signal transfer member by covering the signal transfer member and the device. The protection plate is coupled with the chassis base by a coupling means, and a damage protection means, which is disposed on a side of a coupling part of the protection plate and the chassis base, prevents damage of the device by distributing a coupling force.

20 Claims, 5 Drawing Sheets

PLASMA DISPLAY APPARATUS

CROSS REFERENCE TO RELATED APPLICATION

This application claims priority to and the benefit of Korean Patent Application No. 10-2003-0086062, filed on Nov. 29, 2003, which is hereby incorporated by reference for all purposes as if fully set forth herein.

BACKGROUND OF THE INVENTION

1. Field of the Invention

The present invention relates to a plasma display apparatus, and more particularly, to a plasma display apparatus with an improved structure for protecting a device mounted on a signal transfer member.

2. Discussion of the Background

Generally, a plasma display apparatus is a flat panel display that displays images using light emitted by ultraviolet rays generated in a discharge space filled with a discharge gas. The plasma display apparatus may have a large screen size, be a few centimeters thick, and have a viewing angle greater than 150°. Hence, it is regarded as a next generation display.

Manufacturing a plasma display apparatus may include coupling front and rear display panels, assembling a chassis base on a rear of the display panels, mounting a circuit board on the chassis base, and mounting the resultant product in a case. Japanese Patent Laid-Open publication P2003-162228 discloses an example of a plasma display apparatus.

The display panel may be electrically connected to the circuit board by a flexible tape carrier package (TCP) having a plurality of mounted devices. Mounting the devices on the TCP allows manufactures to reduce the size of the circuit board; therefore, the TCP is widely used.

Devices mounted on the TCP typically have a size of approximately 2 mm×6 mm, and the heat they generate should be rapidly dissipated. Hence, a heat conduction medium may be disposed on an outside of the device. Further, a protection plate, which protects the device and dissipates heat transferred from the heat conduction medium, may be disposed on the chassis base.

However, in this case, the protection plate may be coupled to the chassis base by coupling means such as screws. Coupling pressure between the protection plate and the chassis base may vary according to the height difference between them due to a processing tolerance that may occur during their manufacture. Therefore, after coupling, the protection plate may exert excessive pressure on the device, which may damage the device.

SUMMARY OF THE INVENTION

The present invention provides a plasma display apparatus that may prevent damage of a device due to excessive pressure from a protection plate.

Additional features of the invention will be set forth in the description which follows, and in part will be apparent from the description, or may be learned by practice of the invention.

The present invention discloses a plasma display apparatus comprising a panel for displaying images, a circuit board that drives the panel, and a chassis base that supports the panel and the circuit board. A signal transfer member couples the panel and the circuit board, and a protection plate covers the signal transfer member and a device mounted on the signal transfer member. The protection plate is coupled with the chassis base, and a damage protection means, which is disposed on a side of a coupling part of the protection plate and the chassis base, prevents damage of the device by distributing a coupling force.

The present invention also discloses a plasma display apparatus comprising a panel for displaying images, a circuit board for driving the panel, and a chassis base supporting the panel and the circuit board. A signal transfer member couples the panel to the circuit board and has a mounted device, and a protection plate is coupled to the chassis base and covers the signal transfer member and the mounted device. A coupling pressure relieving unit is disposed on a side of a coupling part of the protection plate and the chassis base to distribute a coupling force.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
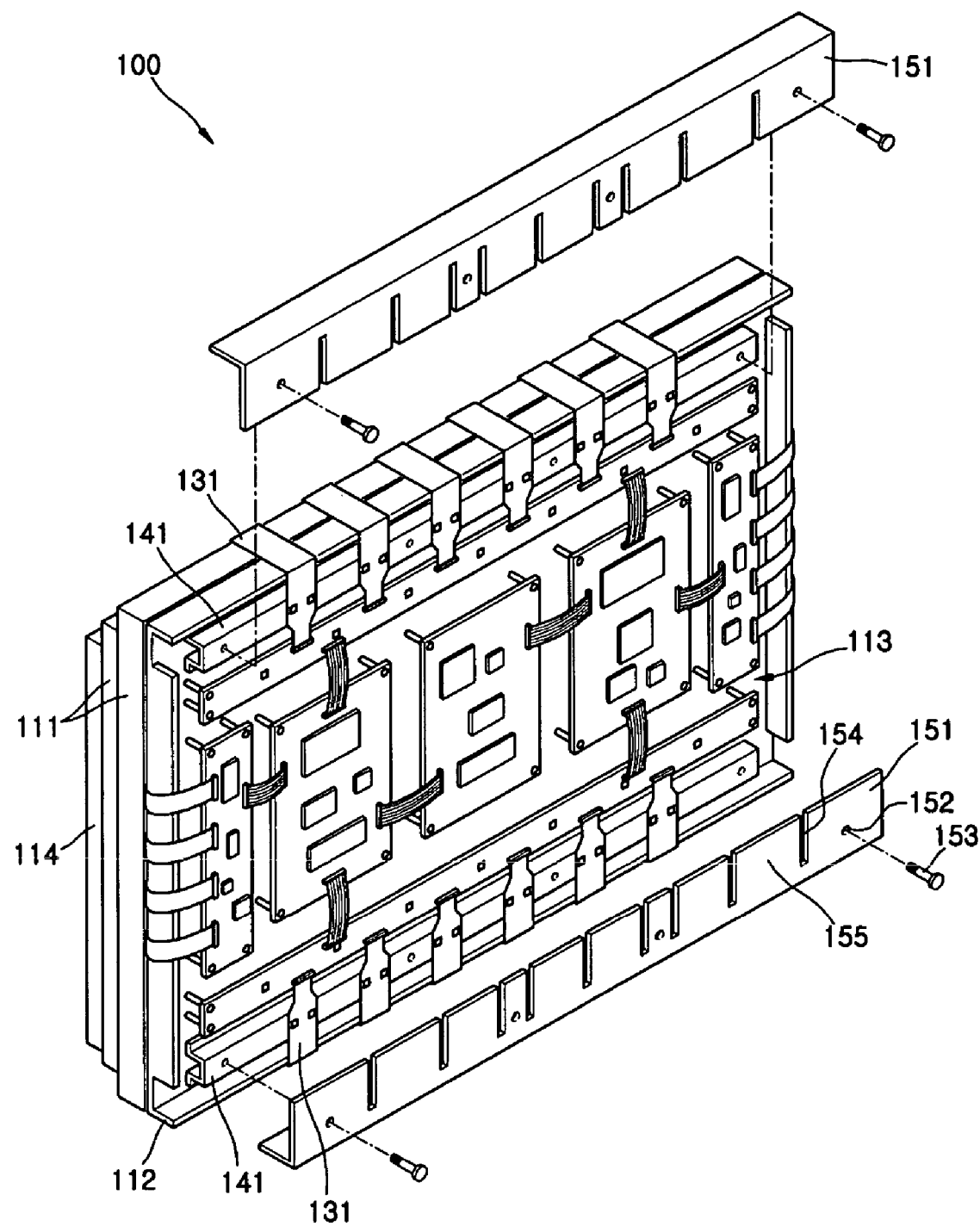
FIG. 1 is a partial exploded perspective view showing a plasma display apparatus according to an exemplary embodiment of the present invention.
Figure 2:
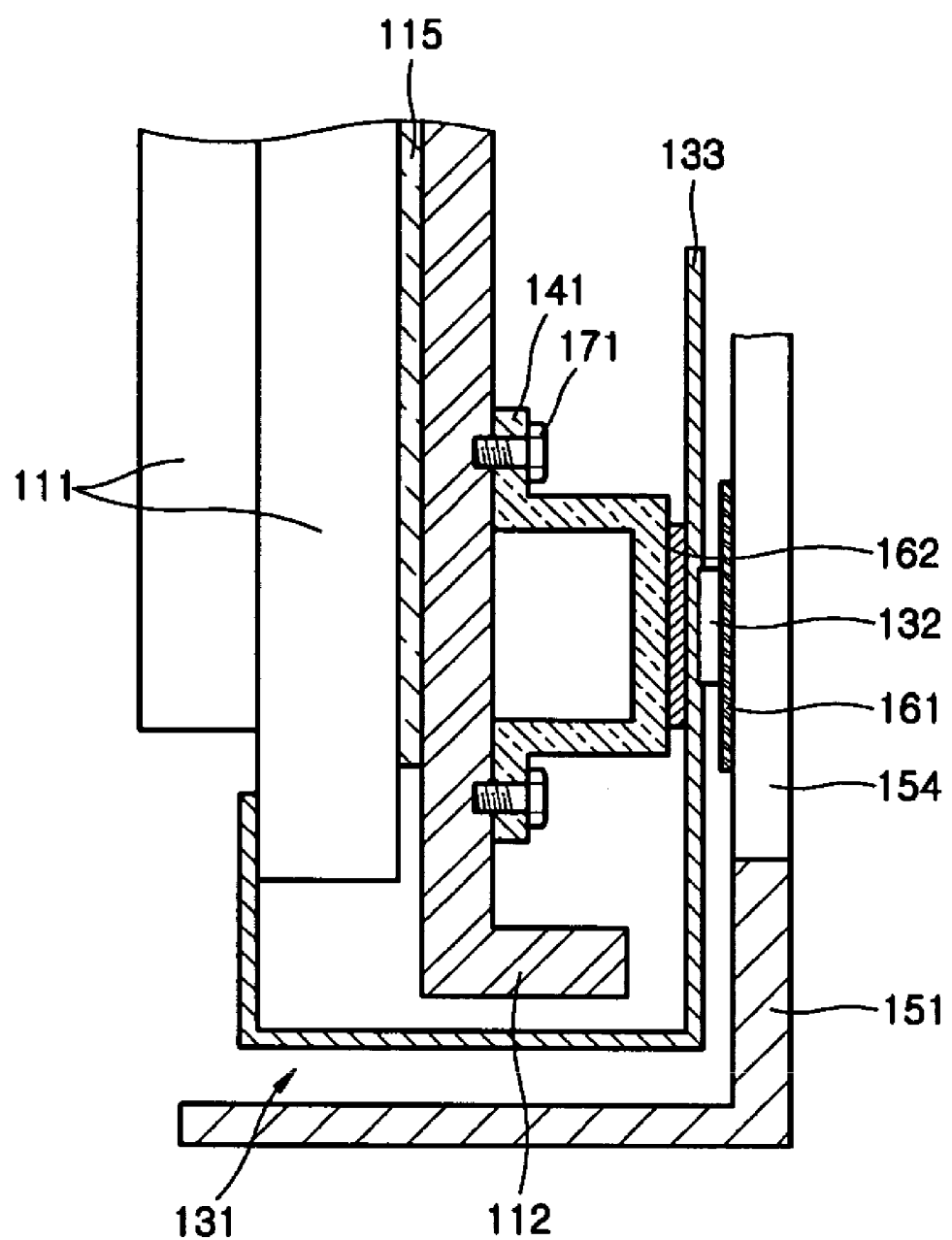
FIG. 2 is a partial side cross-sectional view showing a coupled state of the plasma display apparatus of FIG. 1.

FIG. 1 is a partial exploded perspective view showing a plasma display apparatus according to an exemplary embodiment of the present invention, and FIG. 2 is a partial side cross-sectional view showing a coupled state of the plasma display apparatus of FIG. 1. In the following description, "disposed on" may include, but does not require, actual physical contact.

Figure 3:
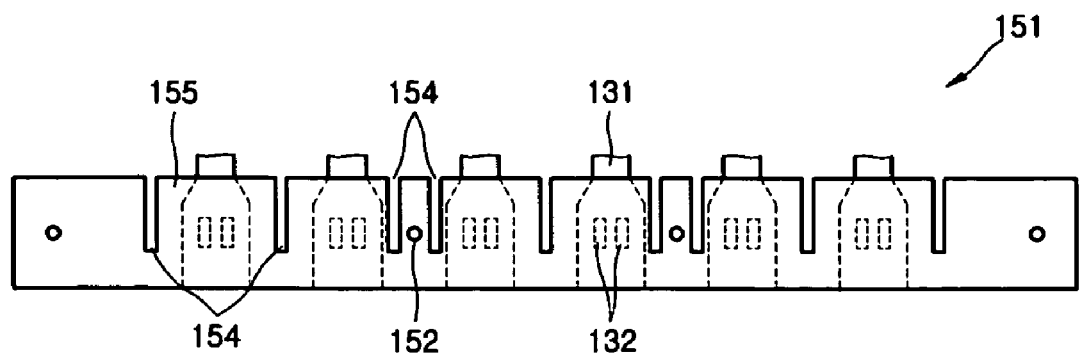
FIG. 3 is a front view showing a coupled state of the protection plate in FIG. 1 with respect to a signal transfer member.

FIG. 3 is a front view showing a coupled state of the protection plate in FIG. 1 with respect to a signal transfer member.

Referring to FIG. 1, FIG. 2 and FIG. 3, a plasma display apparatus 100 according to an exemplary embodiment of the present invention includes a panel 111, a chassis base 112 supporting the panel 111, and a circuit board 113 disposed on a rear of the chassis base 112.

The panel 111 may comprise front and rear panels. The front panel may comprise a plurality of stripe shaped sustain electrodes, bus electrodes coupled to the sustain electrodes, a front dielectric layer covering the sustain electrodes and the bus electrodes, and a protection layer covering the front dielectric layer. The rear panel, which is coupled and sealed with the front panel, may comprise a plurality of address electrodes formed perpendicular to the sustain electrodes, a rear dielectric layer covering the address electrodes, barrier ribs formed on the rear dielectric layer to define discharge spaces and prevent cross-talk, and red, green, and blue fluorescent layers coated in the discharge spaces.

A filter 114 may be disposed on a front surface of the panel 111. The filter 114 may include an electromagnetic shielding layer for shielding harmful electromagnetic waves generated during the panel's operation.

The chassis base 112, which is disposed on a rear of the panel 111, supports the panel 111 and dissipates heat from it.

The panel 111 may be fixed to the chassis base 112 using an adhesion member (not shown) such as double-sided tape. As depicted in FIG. 2, a heat transfer member 115 may be disposed between the panel 111 and the chassis base 112 to dissipate heat generated at the panel 111 to the outside via the chassis base 112.

A circuit board 113 may be mounted at the rear of the chassis base 112. Electronic parts for driving, powering, and displaying images on the panel 111 may be mounted on the circuit board 113.

The panel 111, the chassis base 112, and the circuit board 113 are housed in a case (not shown).

Signal transfer members may be used to couple the circuit board 113 to the panel 111. A signal transfer member may be a TCP or a chip on film (COF). According to exemplary embodiments of the present invention, a TCP 131 having a mounted device 132, such as a driving IC on a tape 133, will now be described.

As shown in FIG. 1 and FIG. 2, one end of the TCP 131 is coupled to the panel 111 via an end part of the chassis base 112, and the TCP's other end is coupled to the circuit board 113. The device 132, which is mounted on the TCP 131, may be disposed on a reinforcing member 141, which may be mounted on the chassis base 112. The device 132 may be mounted on the TCP 131 so that an outer surface of the device 132 faces the protection plate 151. Alternatively, it may be mounted so that its outer surface faces the reinforcing member 141.

The reinforcing member 141, which may be formed of a metal, prevents bending of the chassis base 112 and increases the chassis base's dissipation area, thereby increasing its dissipation efficiency. A screw 171 may couple the reinforcing member 141 to the chassis base 112. The reinforcing member 141 may be omitted.

A protection plate 151 may be disposed outside of the TCP 131 and it may have a bent shape to protect the TCP 131 by covering an outside of the TCP 131. The protection plate 151 may be formed of a metal, such as aluminium, and grounded by coupling it with the chassis base 112 by a coupling means such as a screw. Accordingly, the protection plate 151 may also absorb EMI generated by the device 132.

First and second heat transfer members 161, 162 may be disposed on first and second sides of the TCP 131, respectively. These heat transfer members dissipate heat generated from operation of the device 132.

More specifically, the first heat transfer member 161 may be disposed between the outside surface of the device 132 and an inner surface of the protection plate 151, and the second heat transfer member 162 may be disposed between an inside surface of the device 132 and an outside surface of the reinforcing member 141.

The first heat transfer member 161 may comprise a buffering member since the device 132 directly contacts the first heat transfer member 161. While a liquid or gel type heat conducting medium, such as grease, may be used as the second heat transfer member 162, other suitable alternatives may be used.

As noted above, the protection plate 151 is coupled to the chassis base 112. A damage protection means may be disposed on a side of a coupling part of the protection plate and the chassis base to prevent damage to the device by distributing a coupling force. In an exemplary embodiment of the present invention, a damage protection means may be provided on the protection plate 151. The damage protection means may be disposed adjacent to the coupling holes 152, which are formed so that the protection plate 151 may be coupled to the reinforcing member 141 with screws 153. In this exemplary embodiment, the coupling part comprises a coupling hole 152 and a screw 153.

When the protection plate 151 is coupled to the reinforcing member 141, excessive pressure may be exerted on the device 132. The damage protection means may prevent this excessive pressure from being exerted on the device 132, which may prevent it from being damaged.

As shown in FIG. 1, FIG. 2 and FIG. 3, the damage protection means may comprise cut portions 154 on the protection plate 151.

The cut portions 154 may be disposed on both sides of each coupling hole 152, and they may be cut to a predetermined length from an edge of the protection plate 151 along a direction the TCP 131 extends. While shown having open ends, the present invention is not limited thereto. The cut portions 154 may also be formed in a closed shape with a predetermined length along the direction the TCP 131 extends.

As depicted in FIG. 3, device protection portions 155 of the protection plate 151, which are disposed between the cut portions 154, cover the devices 132. The cut portions 154 may protect the devices 132 from excessive pressing since the cut portions 154 may reduce the coupling force transferred from the coupling parts to the device protection portions 155.

The cut portions 154 may be formed adjacent to the coupling holes 152, and they may also be formed in a space between adjacent TCPs 131. Providing cut portions 154 between adjacent TCPs 131 may further reduce the coupling force transferred to each TCP 131. Therefore, damage of the device 132 from excessive coupling pressure may be prevented by reducing the force applied to the device 132.

Figure 4:
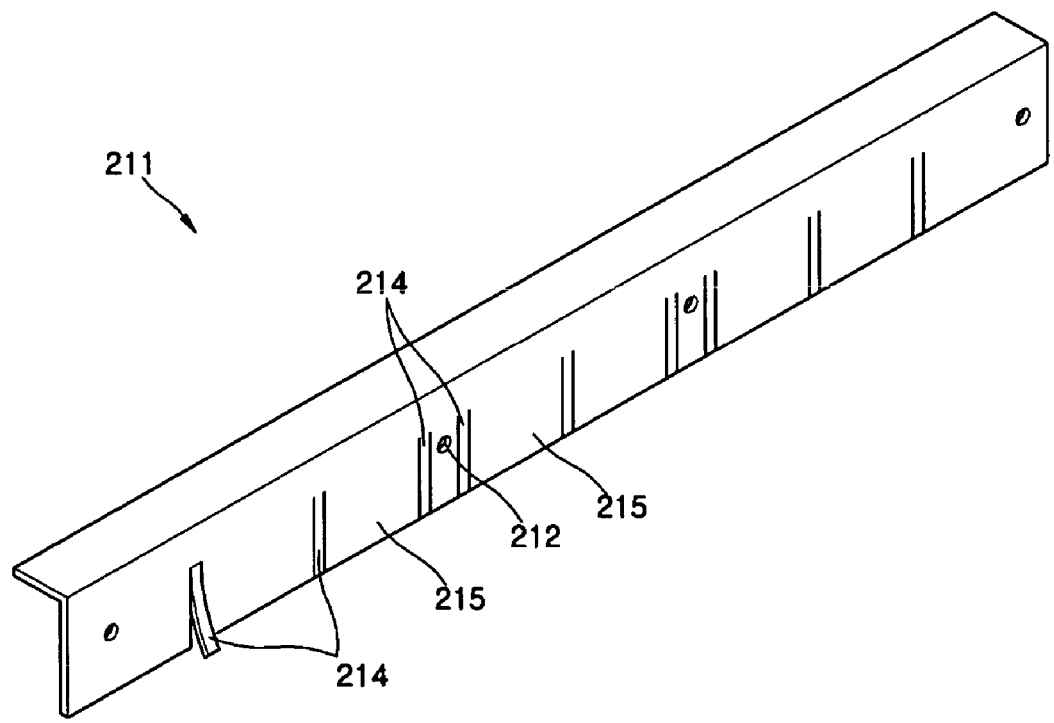
FIG. 4 is a perspective view showing a protection plate according to an exemplary embodiment of the present invention.
Figure 5:
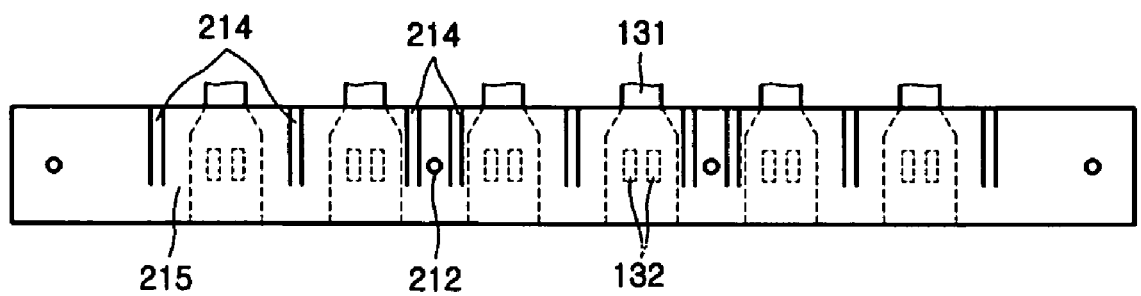
FIG. 5 is a front view showing a coupled state of the protection plate in FIG. 4 with respect to a signal transfer member.

FIG. 4 and FIG. 5 show an alternative damage protection means. Like reference numerals in the previous drawings refer to like elements in the drawing of the present exemplary embodiment, therefore, the detailed description thereof will be omitted.

Referring to FIG. 4 and FIG. 5, the damage protection means may comprise elastic pieces 214 formed in a predetermined length on the protection plate 211.

The elastic pieces 214, like the cut portions 154, may be disposed on both sides of each coupling hole 212. Each elastic piece 214 may have a predetermined width and a predetermined length from an edge of the protection plate 211 along a direction the TCP 131 extends.

As shown in FIG. 5, device protection portions 215 may be disposed covering the device 132 and a portion of the TCP 131. The elastic pieces 214 may distribute and reduce the coupling force transferred to the device protection portions 215 when the protection plate 211 is coupled to the reinforcing member 141.

The elastic pieces 214 may reduce the coupling force generated from assembling the protection plate 211 with the reinforcing member 141. Therefore, the elastic pieces 214 may protect the devices 132 from excessive pressing by the device protection portions 215.

The elastic pieces 214 may be disposed adjacent to the coupling holes 212, and they may also be formed in a space between adjacent TCPs 131. Providing elastic portions 214 between adjacent TCPs 131 may further reduce the coupling force transferred to each TCP 131. Accordingly, damage of the device 132 from excessive pressure may be prevented by reducing the force applied to the device 132.

Figure 6:
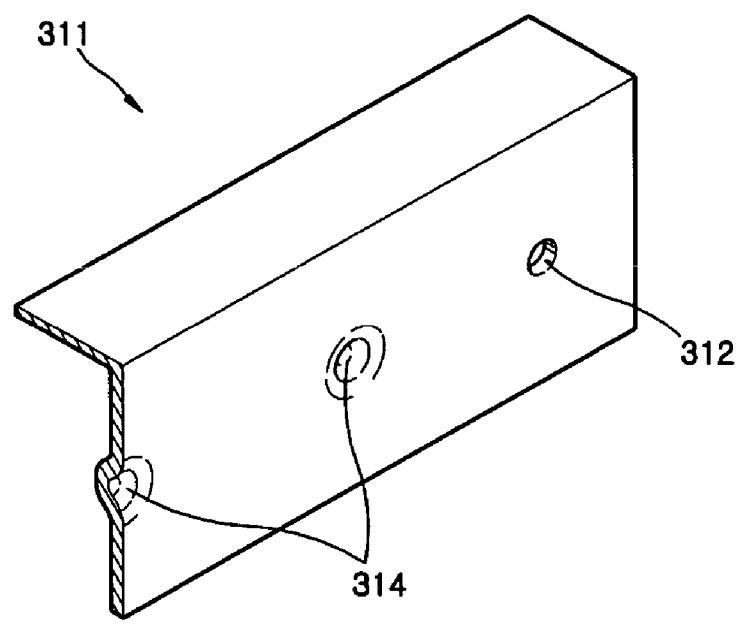
FIG. 6 is a perspective view showing a protection plate according to an exemplary embodiment of the present invention.
Figure 7:
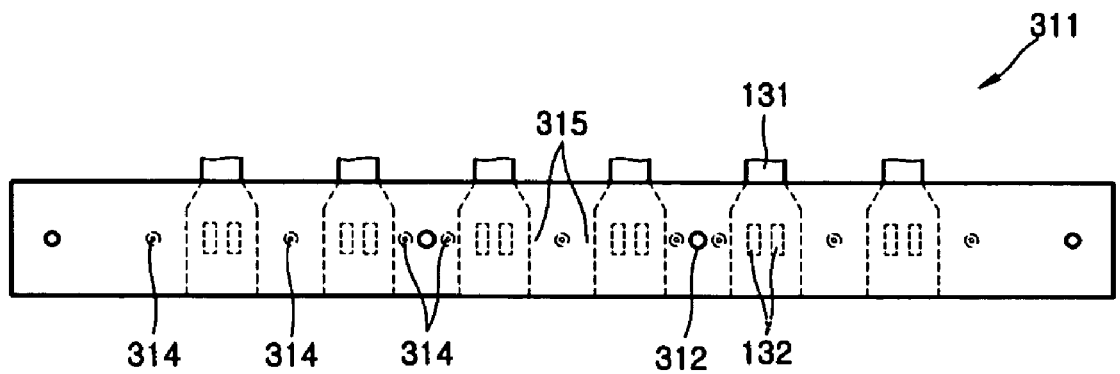
FIG. 7 is a front view showing a coupled state of the protection plate in FIG. 6 with respect to a signal transfer member.
Figure 8:
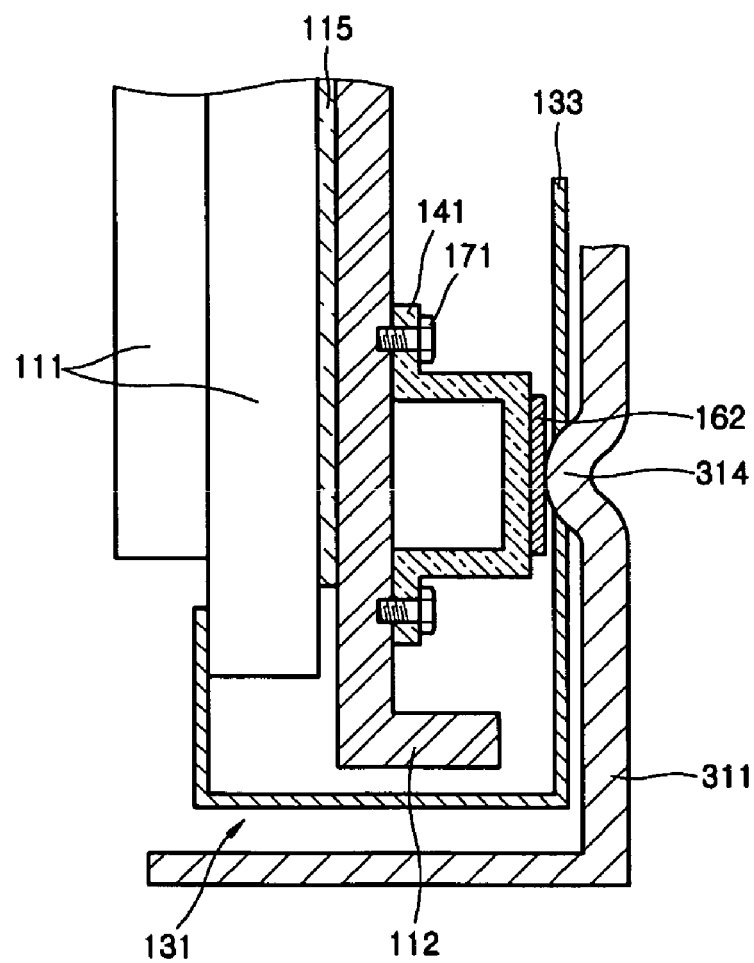
FIG. 8 is a partial side cross-sectional view illustrating a coupled state of a plasma display apparatus having the protection plate of FIG. 6.

FIG. 6, FIG. 7 and FIG. 8 show a protection plate 311 having a damage protection means according to another exemplary embodiment of the present invention.

Referring to FIG. 6, FIG. 7 and FIG. 8, the damage protection means may comprise elastic protrusions 314 formed on the protection plate 311. Like previous exemplary embodiments, the elastic protrusions 314 may be disposed on both sides of each coupling hole 312. The elastic protrusions 314, which may be formed by embossing processing or other like processes, protrude from the protection plate 311 toward the reinforcing member 141.

As shown in FIG. 8, the elastic protrusions 314 may allow the protection plate 311 to be supported elastically with respect to the reinforcing member 141 after coupling them. Accordingly, since the coupling force generated at parts between the reinforcing member 141 and the protection plate 311 may be distributed by offsetting the elastic force generated by the elastic protrusions 314, the devices 132 may be protected from excessive pressing of the device protection portions 315.

The elastic protrusions 314 may be formed adjacent to the coupling holes 312, and they may also be formed in a space between adjacent TCPs 131. Forming elastic protrusions 314 between adjacent TCPs 131 may further reduce the coupling force transferred to each TCP 131. Accordingly, reducing the coupling force applied to the devices 132 may prevent them from being damaged.

While the cut portions, the elastic pieces, and the elastic protrusions were shown being separately formed, they are not limited thereto. It is to be understood that one protection plate may comprise a cut portion, an elastic piece, and an elastic protrusion.

According to exemplary embodiments of the present invention, a damage protection means protects a device from excessive pressing by a device protection unit. The damage protection means may be provided on the protection plate that protects a signal transfer member having a mounted device.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A plasma display apparatus, comprising:
    a panel for displaying images;
    a circuit board that drives the panel;
    a chassis base that supports the panel and the circuit board;
    a signal transfer member coupling the panel to the circuit board;
    a protection plate that covers the signal transfer member and a device mounted on the signal transfer member and is coupled to the chassis base; and
    a first damage protection means disposed on a side of a coupling part of the protection plate and the chassis base,
    wherein the first damage protection means prevents damage to the device by distributing a coupling force.

2. The plasma display apparatus of claim 1, further comprising a second damage protection means between two adjacent signal transfer members.

3. The plasma display apparatus of claim 2, further comprising:
    a reinforcing member that prevents bending of the chassis base,
    wherein the reinforcing member is coupled to the chassis base and the device is disposed on the reinforcing member; and
    wherein the protection plate is coupled to the reinforcing member.

4. The plasma display apparatus of claim 3, wherein the first damage protection means and the second damage protection means each comprise a cut portion on the protection plate.

5. The plasma display apparatus of claim 4, wherein the cut portion is formed from an edge surface of the protection plate and extends along a direction the signal transfer member extends.

6. The plasma display apparatus of claim 3, wherein the first damage protection means and the second damage protection means each comprise an elastic piece on the protection plate.

7. The plasma display apparatus of claim 3,
    wherein the first damage protection means and the second damage protection means each comprise a protrusion on the protection plate; and
    wherein the protrusion protrudes toward the reinforcing member.

8. The plasma display apparatus of claim 1, wherein the protection plate is formed of a metal.

9. The plasma display apparatus of claim 8, wherein the metal is aluminum.

10. The plasma display apparatus of claim 1, further comprising a first heat transfer member between the device and the protection plate.

11. The plasma display apparatus of claim 10, wherein the first heat transfer member comprises a buffering member.

12. The plasma display apparatus of claim 10, further comprising a second heat transfer member between the signal transfer member and the chassis base.

13. The plasma display apparatus of claim 12, wherein the second heat transfer member comprises a liquid phase or a gel type material.

14. The plasma display apparatus of claim 1, wherein the signal transfer member is a tape carrier package.

15. The plasma display apparatus of claim 1, further comprising a filter on a front surface of the panel.

16. The plasma display apparatus of claim 1, further comprising a heat transfer member between the panel and the chassis base.

17. A plasma display apparatus, comprising:
    a panel for displaying images;
    a circuit board for driving the panel;
    a chassis base supporting the panel and the circuit board;
    a signal transfer member coupling the panel to the circuit board and having a mounted device;
    a protection plate coupled to the chassis base and covering the signal transfer member and the mounted device; and a first coupling pressure relieving unit disposed on a side of a coupling part of the protection plate and the chassis base, wherein the first coupling pressure relieving unit distributes a coupling force.

18. The plasma display apparatus of claim 17, further comprising a second coupling pressure relieving unit between two adjacent signal transfer members.

19. The plasma display apparatus of claim 18, further comprising:

a reinforcing member preventing bending of the chassis base, wherein the reinforcing member is coupled to the chassis base and the mounted device is disposed on the reinforcing member; and wherein the protection plate is coupled to the reinforcing member.

20. The plasma display apparatus of claim 19, wherein the first coupling pressure relieving unit is a cut portion, an elastic piece, or a protrusion, and wherein the second coupling pressure relieving unit is a cut portion, an elastic piece, or a protrusion.

* * * * *